United States Patent
Bierbooms

(10) Patent No.: US 9,694,986 B2
(45) Date of Patent: Jul. 4, 2017

(54) TRANSPORT DEVICE AND TRANSPORT METHOD FOR TRANSPORTING A FRAGILE OBJECT

(71) Applicant: Robert Bosch GmbH, Stuttgart (DE)

(72) Inventor: Rob Bierbooms, Best (NL)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/957,710

(22) Filed: Dec. 3, 2015

(65) Prior Publication Data

US 2016/0159578 A1    Jun. 9, 2016

(30) Foreign Application Priority Data

Dec. 5, 2014  (EP) .................................. 14196446

(51) Int. Cl.
| | |
|---|---|
| *B65G 21/20* | (2006.01) |
| *B65G 43/00* | (2006.01) |
| *H01L 21/677* | (2006.01) |
| *B65G 54/02* | (2006.01) |

(52) U.S. Cl.
CPC ............. *B65G 43/00* (2013.01); *B65G 54/02* (2013.01); *H01L 21/67709* (2013.01); *B65G 2811/0673* (2013.01)

(58) Field of Classification Search
CPC ........ B65G 47/28; B65G 43/08; B65G 43/00; B65G 54/02
USPC ........................................................ 198/805
See application file for complete search history.

(56) References Cited

U.S. PATENT DOCUMENTS

| | | | | |
|---|---|---|---|---|
| 4,055,123 | A * | 10/1977 | Heidelberg ........... | B60L 13/035 104/282 |
| 4,690,066 | A | 9/1987 | Morishita et al. | |
| 5,180,048 | A * | 1/1993 | Kawada ................. | B65G 54/02 198/619 |
| 6,283,039 | B1 * | 9/2001 | Takayanagi ............ | B65G 54/02 104/292 |
| 7,990,084 | B2 * | 8/2011 | Kim ....................... | H02K 41/03 310/12.17 |
| 2013/0259610 | A1 * | 10/2013 | Halloran ........... | H01L 21/67173 198/341.01 |
| 2014/0180471 | A1 * | 6/2014 | Haring ................... | B65G 54/02 700/230 |
| 2015/0303841 | A1 * | 10/2015 | Suzuki .................... | H02P 6/006 318/38 |

(Continued)

FOREIGN PATENT DOCUMENTS

| | | | | |
|---|---|---|---|---|
| EP | 0 768 705 A2 | 4/1997 | | |
| EP | 2746201 | * | 6/2014 | ............. B65G 54/02 |
| WO | 03/038869 A2 | 5/2003 | | |

*Primary Examiner* — James R Bidwell
(74) *Attorney, Agent, or Firm* — Maginot, Moore & Beck LLP

(57) ABSTRACT

A transport device and a transport method for transporting a fragile object, in particular a semiconductor wafer, a glass panel, a solar module, etc., are provided. The transport device comprises at least two coils configured to drive the object along a predetermined movement path, and a control unit configured to control a movement of the object along the predetermined movement path. The control unit is further configured to base the control of the movement of the object on at least a third order setpoint profile. The control unit is also configured to generate the third order setpoint profile for at least two coils in a synchronized manner.

11 Claims, 4 Drawing Sheets

(56) References Cited

U.S. PATENT DOCUMENTS

2015/0344233 A1\* 12/2015 Kleinikkink ........... G05B 19/00
  700/230

\* cited by examiner

TRANSPORT DEVICE AND TRANSPORT METHOD FOR TRANSPORTING A FRAGILE OBJECT

This application claims priority under 35 U.S.C. §119 to patent application no. EP 14196446.0, filed on Dec. 5, 2014 in Europe, the disclosure of which is incorporated herein by reference in its entirety.

BACKGROUND

The present invention relates to a transport device and a transport method for transporting a fragile object.

In the field of producing semiconductor devices, semiconductor chips with integrated circuits are produced, for example. Herein, fragile objects like for example wafers, glass panels, solar modules etc. are transported. Because of the fragility of the objects, high caution is required when handling the objects to prevent damaging, like breaking, of the fragile objects.

For transporting a fragile object to a predefined position during a production process, a linear motor can be used, which operates according to an 'inverted motor principle'. 'Inverted motor principle' means that compared to a normal situation of a linear motor the opposite component moves, namely the magnet plate (secondary part of the motor) moves whereas in a normal linear motor, the coil (primary part of the motor) moves.

Such a linear motor operating according to an inverted motor principle moves a carrier with the fragile object thereon along a movement path. For this purpose, coils of the linear motor are activated or deactivated in succession to move the carrier along the movement path or to stop the carrier at the predefined or desired position on the movement path. The linear motor operating according to an inverted motor principle and the coils are also named LMS system hereinafter.

In current LMS systems, for starting a movement of a carrier, acceleration is applied instantaneously to a carrier positioned on a coil. In a similar way, when stopping a carrier, deceleration is applied instantaneously to the carrier. This results in an abrupt start or stopping of the movement of the carrier. Thus, the object carried by such a carrier in the LMS system can start to vibrate because of the abrupt start or stopping of the movement. This can lead to a damage of the objects.

SUMMARY

Therefore, it is an object of the present invention to provide a transport device and a transport method for transporting a fragile object, which device and method can solve the above mentioned problems. In particular, it is an object of the present invention to provide a transport device and a transport method for transporting a fragile object, wherein the transport device and the transport method can prevent a damage of the fragile object securely, easily and with low costs.

This object is solved by a transport device for transporting a fragile object according to the features of claim 1. The transport device comprises at least two coils for driving the object along a predetermined movement path, and a control unit for controlling a movement of the object along the predetermined movement path, wherein the control unit is further configured to base the control of the movement of the object on at least a third order setpoint profile, and wherein the control unit is further configured to generate the third order setpoint profile for at least two coils in a synchronized manner.

The above described transport device ensures a smooth movement and thus transport of the carriers. Consequently, no abrupt starting or stopping occurs with the transport device when transporting the objects positioned on the carriers. This can prevent a vibration of the objects so that there is no risk of damaging a transported object even if the object is a fragile object like a wafer, a glass panel, a solar module etc..

Further advantageous developments of the transport device are set out in the dependent claims.

Possibly, the transport device further comprises a carrier for carrying the fragile object along the predetermined movement path. Herein the third order setpoint profile is a position of the carrier and/or is a velocity of the carrier and/or is an acceleration of the carrier and/or is a jerk of the carrier.

The third order setpoint profile for the at least two coils could partly overlap each other to form the entire third order setpoint profile for the movement path.

In one configuration, the control unit comprises a setpoint generator for generating the setpoint profile for each coil based on a setpoint profile for the movement path and dependent on a setpoint profile to be generated for an adjacent coil which is part of the movement path, and a determining module for determining whether an actual position detected by a sensor is present in the setpoint profile generated by the setpoint generator for a coil to which the sensor is allocated, wherein the control unit is configured to control the activation or deactivation of the coils on the basis of a determining result of the determining module. In other words, the control unit enables/disables power delivered to a coil based on the actual position of a carrier. That means a sensor detects a carrier and measure through the sensor the position of the carrier, and if the position is within the control range of the coil, the coil is activated. If a sensor doesn't detect a carrier, it is not activated.

Further, the actual position of a carrier is compared to the setpoint position. The amount of power a coil delivers depends on this result (the larger the difference, the more power it outputs, trying to 'speed up' or 'slow down' the carrier.

The transport device can further comprise at least two sensors for detecting the position and/or the velocity of the carrier, wherein the at least two sensors are positioned such that two of the sensors are positioned adjacent to one coil.

It is conceivable that the control unit and the sensors are connected by a data bus. Herein, the data bus is a serial bus.

The transport device is advantageously a part of a machine for treating a semiconductor wafer. Herein, the transport device is usable for transporting the semiconductor wafer in the machine.

The above mentioned object is further solved by a transport method for transporting a fragile object according to the features of claim 10. The transport method comprises the steps of: generating a third order setpoint profile for each coil of at least two coils in a synchronized manner, and is driving, by the at least two coils, an object along a predetermined movement path under the control of a control unit based on the generated third order setpoint profile for each coil.

The above described transport method is performed by the above described transport device. Therefore, the transport method provides the same advantages as mentioned above for the transport device.

Further possible implementations of the invention comprise also combinations or features or styles described above or in the following with reference to the embodiments, even if they are not explicitly mentioned. Herein, the person skilled in the art will also add single aspects as improvements or additions to the respective basic form of the invention.

BRIEF DESCRIPTION OF THE DRAWINGS

In the following, the present invention is described in more detail by means of embodiments and with reference to the appended drawing Figures, wherein.

In the figures, the same or functionally the same elements are provided with the same reference signs unless given otherwise.

DETAILED DESCRIPTION

Figure 1:
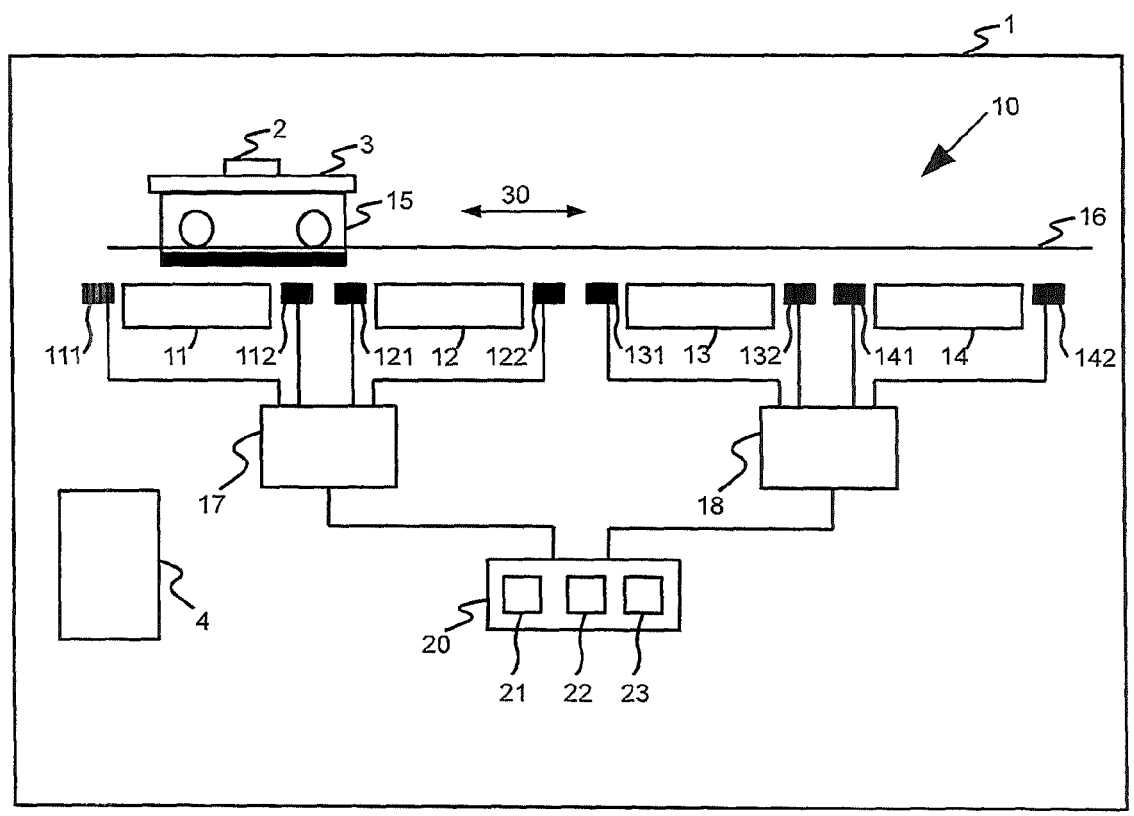
FIG. 1 is a schematic diagram for explaining a machine having a transport device according to a first embodiment.

FIG. 1 shows a machine 1 for producing one or more semiconductor chip(s) 2 on the basis of a semiconductor wafer 3 or for producing one or more solar cell(s). The solar cells could form the basis of a solar module 4. The semiconductor wafer 3 and the solar module 4 are each fragile objects 3, 4 which can break easily and which are therefore to be handled with due care to prevent a damage thereof.

The machine 1 comprises a transport device 10 for transporting a fragile object 3, 4. For this purpose, the transport device 10 comprises first to fourth coils 11 to 14, a carrier 15 movable along a movement path 16 positioned on the coils 11 to 14, multiplexers 17, 18, a control unit 20, and sensors 111, 112, 121, 122, 131, 132, 141, 142. The control unit 20 comprises a storing module 21, a setpoint generator 22, and a determining module 23. The setpoint generator 22 and the determining module 23 could be part of a motion control unit which is a part of the control unit 20 and which is not shown. The control unit 20 can also comprise at least one drive unit for actually powering the coils 11 to 14. The drive unit(s) are not shown, too. The first to fourth coils 11 to 14 form a linear motor and are configured as a LMS system.

The coils 11 to 14 can drive the carrier 15 such that the carrier 15 is movable in a motion direction 30 which is shown in FIG. 1 by a black arrow. That is, the carrier 15 is driven together with the semiconductor wafer 3 mounted thereon along the movement path 16. Herein, the carrier 15 can be moved in only one direction of the motion direction 30 or in reciprocating motion as shown in FIG. 1. The motion of the carrier 15 can be detected by the sensors 111, 112, 121, 122, 131, 132, 141, 142. For transmitting the sensor signal to the multiplexers 17, 18, the sensors 111, 112, 121, 122, 131, 132, 141, 142 are connected with the multiplexers 17, 18 with sensor cables. The multiplexers 17, 18 transmit the sensor signals via multiplexed sensor cables to the control unit 20.

The sensors 111, 112 are allocated to the first coil 11, wherein the sensor 111 detects a presence of the carrier 15 on the left side of the coil 11 in FIG. 1 and the sensor 112 detects a presence of the carrier 15 on the right side of the coil 11 in FIG. 1. The sensors 121, 122 are allocated to the second coil 12, wherein the sensor 121 detects a presence of the carrier 15 on the left side of the coil 12 in FIG. 1 and the sensor 122 detects a presence of the carrier 15 on the right side of the coil 12 in FIG. 1. The sensors 131, 112 are allocated to the third coil 13, wherein the sensor 131 detects a presence of the carrier 15 on the left side of the coil 13 in FIG. 1 and the sensor 132 detects a presence of the carrier 15 on the right side of the coil 13 in FIG. 1. The sensors 141, 142 are allocated to the fourth coil 14, wherein the sensor 141 detects a presence of the carrier 15 on the left side of the coil 14 in FIG. 1 and the sensor 142 detects a presence of the carrier 15 on the right side of the coil 14 in FIG. 1.

In FIG. 1, the carrier 15 is detected by the sensors 112 and 121 so that the control unit 20 recognizes that the carrier 15 is positioned above the first and second coil 11, 12. In other words, the control unit 20 recognizes the first and second coil 11, 12 as the position of the carrier 15. Dependent on the setpoints generated by the setpoint generator 21 and provided for a control performed by the control unit 20, the control unit 20 controls the activation or deactivation of the coils 11 to 14 so that the carrier 15 moves to the position setpoint for the carrier 15.

In particular, the sensors 111, 112, 121, 122, 131, 132, 141, 142 can detect the actual position of the carrier 15 and forward the result to the control unit 20 so that the actual position of the carrier 15 is stored in the storing module 21. In addition, the determining module 23 can determine the actual velocity of the carrier 15 based on the detected actual position of the carrier 15. The actual velocity is calculated as the first derivative of the actual position. However, because of noise, higher order derivatives are not used. Therefore, the determining module 23 does not calculate the actual acceleration, which is the second derivative of the actual position, or the actual jerk, which is the third derivative of the actual position.

Further, based on the detected actual position, the determining module 23 can determine, whether the detected actual position is identical to a setpoint in a setpoint profile for the position of the carrier 15 set in advance by the setpoint generator 22.

That is, by the determining module 23, two things are determined, namely, is the carrier 15 within the control range of a coil 11 to 14, which is based on the position measured by at least one of the sensors 111, 112, 121, 122, 131, 132, 141, 142, and what is the difference between the setpoint position and the actual position. Based on the determining result, more of less force is delivered to the concerned coils 11 to 14. Thus, the actual position is compared to the setpoint and based on the difference between the actual position and the setpoint, the determining module 23 determines how much power should be delivered to the concerned coils 11 to 14.

Figure 2:
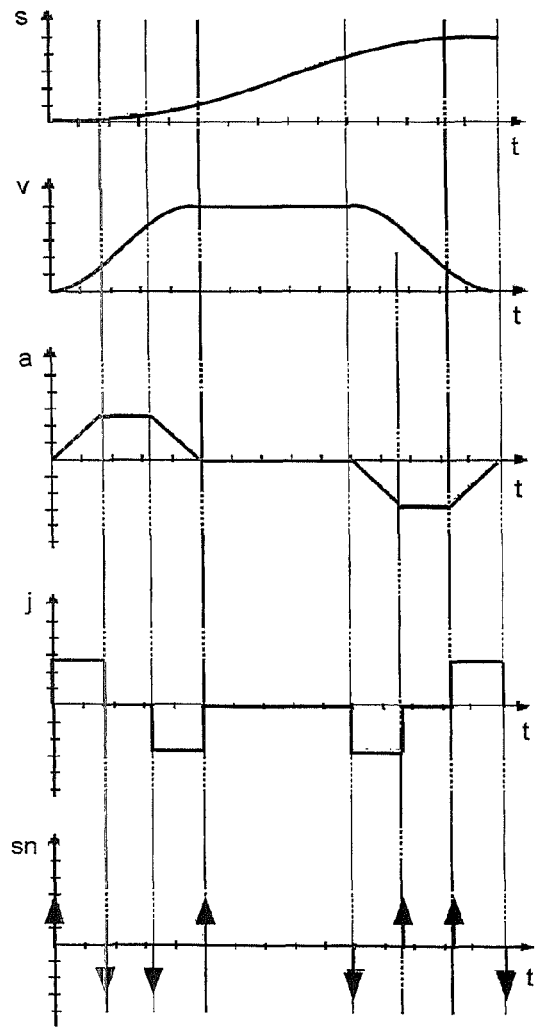
FIG. 2 is a diagram of a variation in time of position, velocity, acceleration, jerk, and snap for a carrier in the transport device according to the first embodiment.

To achieve a smooth movement of the carrier 15, the setpoint generator generates setpoint profiles as shown in FIG. 2.

FIG. 2 shows a setpoint profile for the position s of the carrier 15 over the time t, a setpoint profile for the velocity v of the carrier 15 over the time t, a setpoint profile for the acceleration a of the carrier 15 over the time t, a setpoint profile for the jerk j of the carrier 15 over the time t, and a setpoint profile for the snap sn of the carrier 15 over the time t. In FIG. 2, the first to third derivatives v, a, j of the position s are each present. Instead, the fourth to derivative, the snap sn, is infinite where the jerk j changes. This is indicated by the black arrows in FIG. 2. The snap sn is zero otherwise. Thus, there is no fourth derivative for the setpoint profile for the position s of the carrier 15 according to FIG. 2. As a result, the setpoint profile for the position s of the carrier 15 according to FIG. 2 is called third order setpoint profile.

As derivable from the variations in time of FIG. 2, the setpoint profile of the position s and the velocity v has no abrupt changes so that the resulting movement of the carrier 15 following such setpoint profiles will be smooth enough to carry a fragile object 3, 4 without the risk of damaging the fragile object 3, 4.

Figure 3:
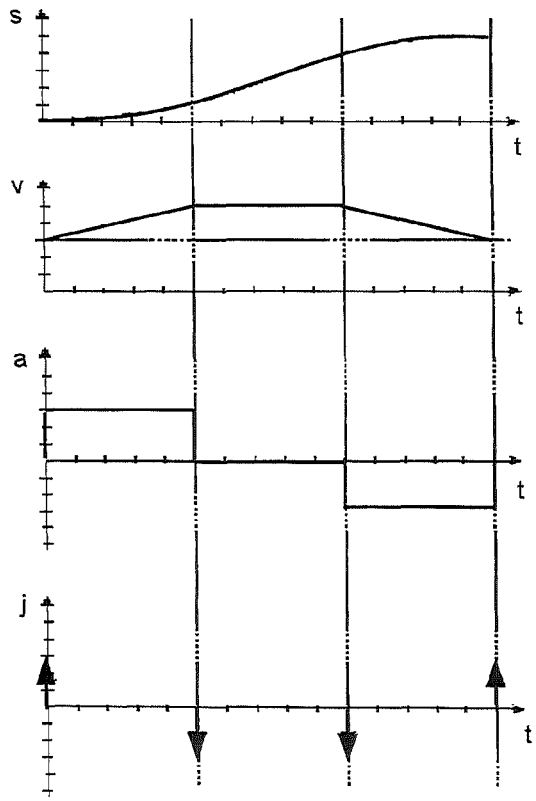
FIG. 3 is a diagram of a variation in time of the position, the velocity, the acceleration, and the jerk for a carrier in a transport device according to a modification of the first embodiment.

FIG. 3 shows in a modification of the first embodiment a setpoint profile for the position s of the carrier 15 over the time t, a setpoint profile for the velocity v of the carrier 15 over the time t, a setpoint profile for the acceleration a of the carrier 15 over the time t, and a setpoint profile for the jerk j of the carrier 15. Here, already the third derivative, the jerk j of the carrier 15, is infinite where the jerk j changes. This is indicated by the black arrows in FIG. 2. The jerk j is zero otherwise. Thus, there is no third derivative for the setpoint profile for the position s of the carrier 15 according to FIG. 3. As a result, the setpoint profile for the position s of the carrier 15 according to FIG. 3 is called second order setpoint profile.

As derivable from the variations in time of FIG. 3, the setpoint profile of the velocity v has abrupt changes, what is clearly visible from the edges in the velocity v in FIG. 3. Consequently, the movement of the carrier 15 following the setpoint profiles of FIG. 2 will be much smoother than the movement of the carrier 15 following the setpoint profiles of FIG. 3. Therefore, for the carrier 15, a movement with a third order setpoint profile or higher is preferred.

Figure 4:
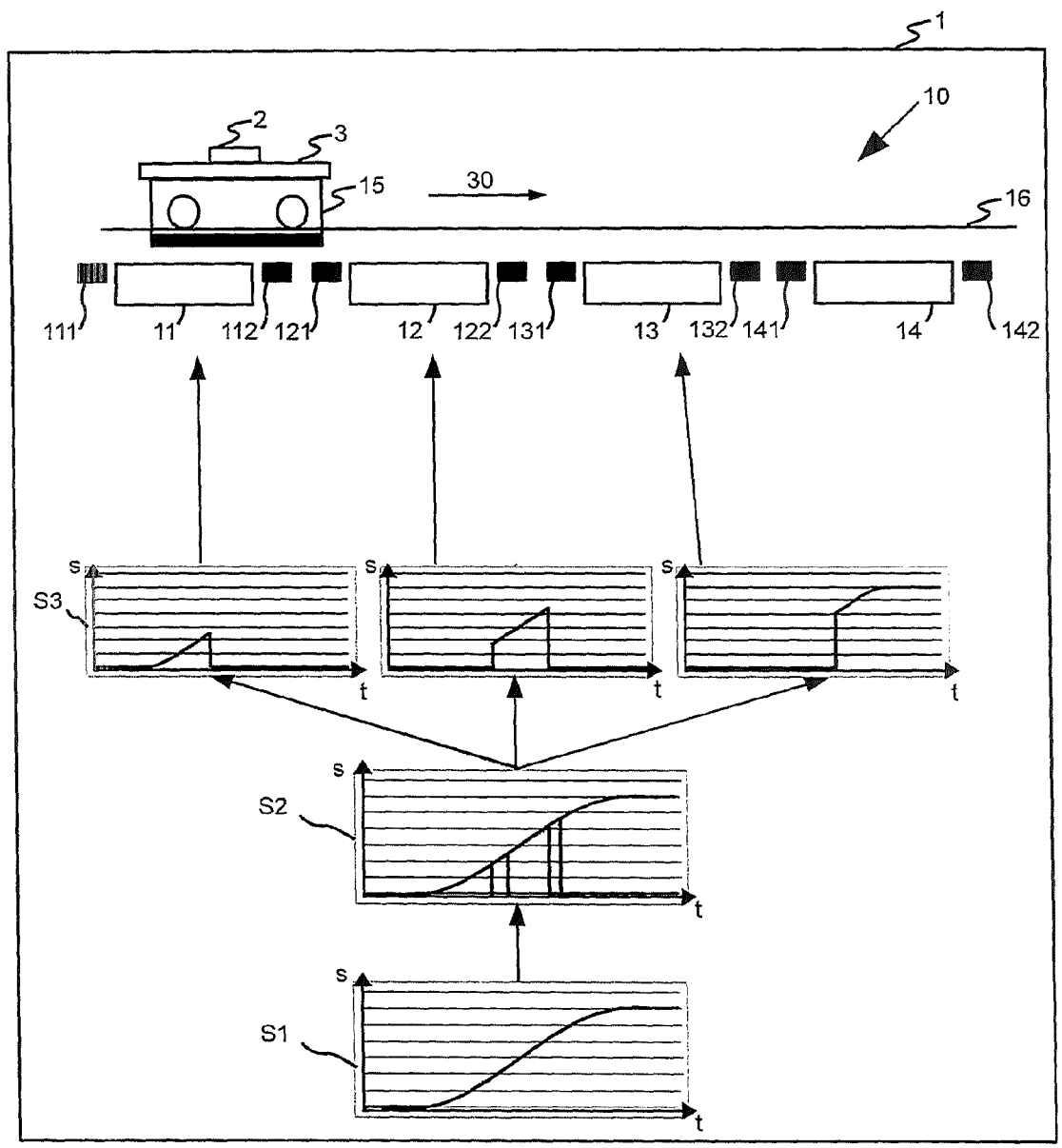
FIG. 4 is a diagram for explaining a transport method according to the first embodiment.

FIG. 4 shows an example in which the carrier 15 shall be moved starting from the coil 11 along the movement path 16 along the coils 12, 13 in this order. The coils 12, 13 are adjacent to each other. The coils 13, 14 are adjacent to each other.

In this example, the setpoint generator 22 generates in a step S1 a setpoint profile for the position s, which has a variation in the time t as shown in FIG. 4 and which is preferably like the variation in time shown in FIG. 2 for the position s. Further in the step S1, the setpoint generator 22 can generate a setpoint profile for the velocity v, a setpoint profile for the acceleration a, and a setpoint profile for the jerk j accordingly.

Thereafter, in a step S2, the setpoint generator 22 separates the setpoint profile generated in the step S1 for the position s into three setpoint profile segments, as shown in FIG. 4. Herein, the three setpoint profile segments overlap each other at the edges thereof, so that the overlapping parts of the setpoint profile segments are both part of a setpoint profile for two adjacent coils. Further in the step S2, the setpoint generator 22 can generate for each of the coils 11, 12, 13 setpoint profile segments for the velocity v, setpoint profile segments for the acceleration a, and setpoint profile segments for the jerk j accordingly.

In a following step S3, the three setpoint profile segments are stored as a setpoint profile for the position s of the carrier for the coil 11, a setpoint profile for the position s of the carrier for the coil 12, and a setpoint profile for the position s of the carrier for the coil 13, as indicated in FIG. 4 with the black arrows. Further in the step S3, the setpoint generator 22 can store for each of the coils 11, 12, 13 the setpoint profile segments for the velocity v, the setpoint profile segments for the acceleration a, and the setpoint profile segments for the jerk j accordingly.

Thereafter, the coils 11, 12, 13 can drive the carrier 15 possibly loading an object 3, 4 along the movement path 16 under the control of the control unit 20 based on the generated third order setpoint profiles for the coils 11, 12, 13.

Thus, when moving the carrier 15 along the movement path 16, each coil of the coils 12, 13, 14 will handle a part of the entire movement to be achieved by the carrier 15 along the coils 11, 12, 13.

As a result, in the above described transport device 10, the setpoint profiles are generated by the setpoint generator 22 over all the axes of the coils involved in the transport of the object 3 synchronously. In other words, the control unit 20, in particular the setpoint generator 22, generates the third order setpoint profile for the coils 11, 12, 13 in a synchronized manner. Thus, a smooth movement, in particular a smooth acceleration and deceleration, of the carrier 15 can be achieved. As mentioned above, the movement with setpoint profiles s, v, a, j, sn according to FIG. 2 is smoother than the movement with setpoint profiles s, v, a, j according to FIG. 3. Nevertheless, the chance of vibrations in the fragile object 3, 4 carried by the carrier 15 over the coils 11 to 13 can be reduced to a minimum.

Figure 5:
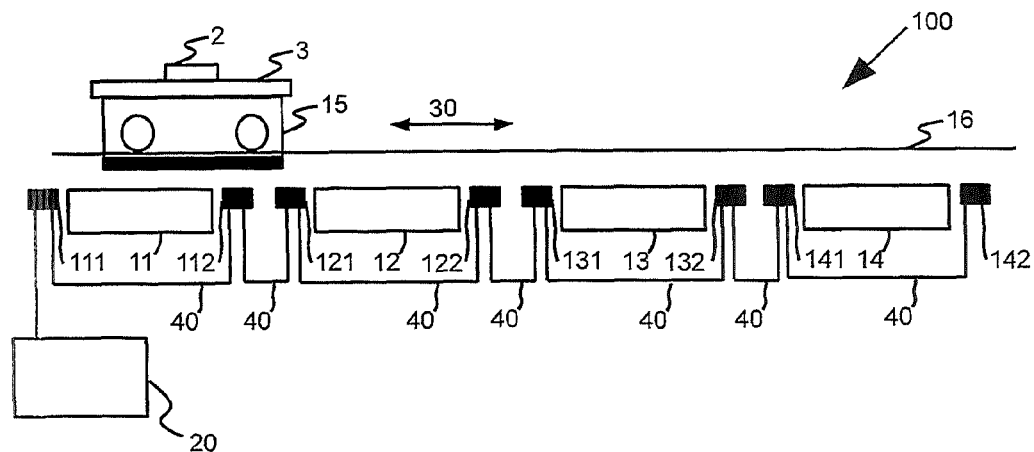
FIG. 5 is a schematic diagram for explaining a transport device according to a second embodiment.

FIG. 5 shows a transport device 100 according to a second embodiment. The transport device 100 according to the second embodiment is configured in many parts like the transport device 10 according to the first embodiment. Thus, only the differences between the transport devices 10, 100 will be described.

The transport device 100 according to the second embodiment has a modular position sensor bus layout. Following this, all of the sensors 111, 112, 121, 122, 131, 132, 141, 142 are connected by a data bus 40 to the control unit 20. Therefore, the multiplexers 17, 18 can be omitted. In particular, the data bus 40 is a CAN bus (CAN=Controller Area Network) transmitting data according to the CAN protocol as described in ISO11898. The data bus can however be any other adequate field bus or serial bus like ProfiBus, SERCOSIII, etc.

Figure 6:
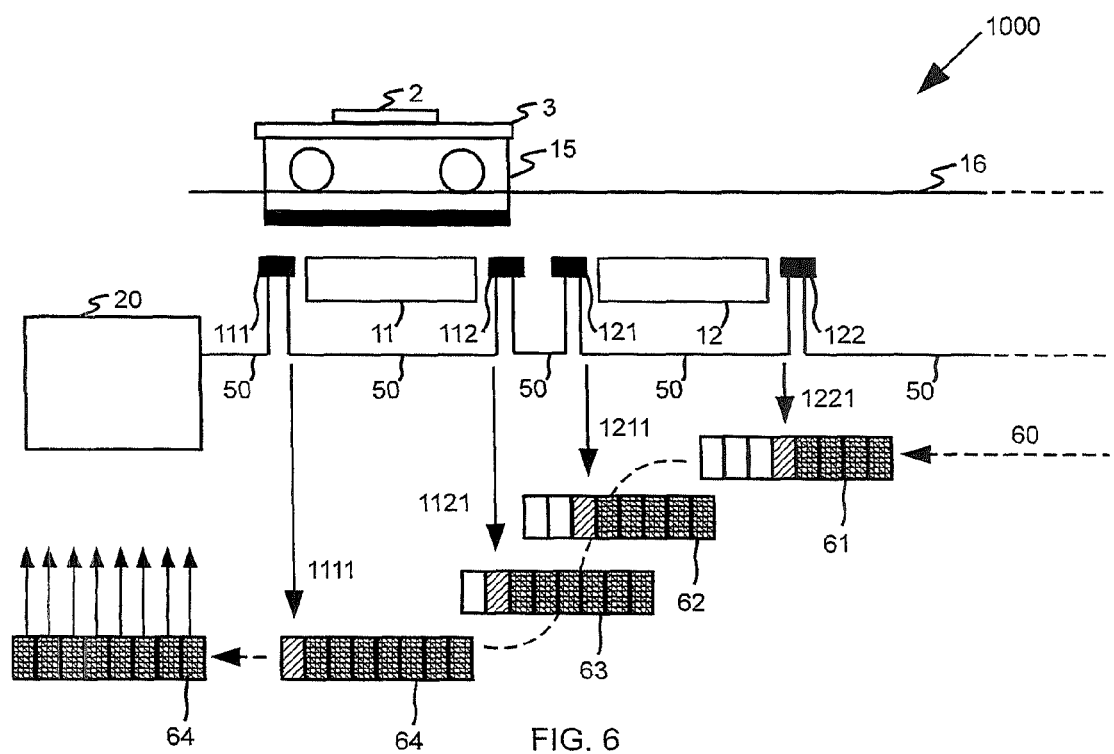
FIG. 6 is a schematic diagram for explaining a transport device according to a third embodiment.

FIG. 6 shows a transport device 1000 according to a third embodiment. The transport device 100 according to the third embodiment is configured in many parts like the transport device 10 according to the first embodiment. Thus, only the differences between the transport devices 10, 1000 will be described.

The transport device 1000 according to the third embodiment has a modular position sensor bus layout like the transport device 100 according to the second embodiment. Thus, all of the sensors 111, 112, 121, 122, 131, 132, 141, 142 are connected by a data bus 50 to the control unit 20. Therefore, the multiplexers 17, 18 can be omitted again.

In addition, the data bus 50 is configured such that data transmitted with the data bus 50 can be changed on the fly. Therefore, the sensors 111, 112, 121, 122, 131, 132, 141, 142 do not receive data from other sensors but only add their own data to data received by other sensors. Due to this, the data 60 transmitted by other sensors, which are not shown in FIG. 6, can be changed by the sensor 122 such that the sensor 122 adds data 1221 to the data 60 what results in data 61. That is, the sensor 121 sees data 61 from the sensor 122. Then, the sensor 121 can add data 1211 to the data 61 what results in data 62. That is, the sensor 112 sees data 62 from the sensor 121. Then, the sensor 112 can add data 1121 to the data 62 what results in data 63. That is, the sensor 111 sees data 63 from the sensor 112. Then, the sensor 111 can add data 1111 to the data 63 what results in data 64.

The data 64 is transmitted via the data bus 50 to the control unit 20 which can process the data 64 further, as described in the first embodiment.

For example, the data bus 50 is a serial bus, in particular, transmitting data according to the EtherCAT (Ethernet for Control Automation Technology) standard determined in IEC 61158 or any other suitable serial bus.

The processing of the data in the transport device 1000 according to the third embodiment is much faster than in the transport device 100 according to the second embodiment.

All of the above-described implementations of the transport devices 10, 100, 1000 and the transport method performed by the transport devices 10, 100, 1000 can be used separately or in all possible combinations thereof. The features of the first and second embodiments are combinable with each other or can be used alone. In addition, in particular, the following modifications are conceivable.

The dimensions shown in the drawings are used for illustrating the principle of the invention and are not limiting.

The elements shown in the figures are depicted schematically and can differ in the specific implementation from the forms shown in the figures provided that the above-described functions are ensured.

It is not mandatory that the machine 1 is configured to produce a semiconductor chip 2 on the basis of a semiconductor wafer 3. The machine 1 can also be configured to produce other products, wherein objects 3, 4 are to be carried with the transport device 10, 100, 1000.

The number of the coils 11, 12, 13, 14 can be selected arbitrarily.

In addition or alternatively, the storing module 21 can be arranged externally from the control unit 20. In addition or alternatively, the setpoint generator 22 can be arranged externally from the control unit 20. In addition or alternatively, the determining module 23 can be arranged externally from the control unit 20.

The invention claimed is:

1. A transport device for transporting an object, the transport device comprising:
   at least two coils configured to drive the object along a predetermined movement path; and
   a control unit configured to:
      generate a setpoint profile, the setpoint profile being at least a third order function;
      generate at least two setpoint profile segments based on the setpoint profile, the at least two setpoint profile segments corresponding to the at least two coils respectively; and
      control a movement of the object along the predetermined movement path by driving each of the at least two coils based a respective one of the at least two setpoint profile segments.

2. The transport device according to claim 1, further comprising:
   a carrier configured to carry the object along the predetermined movement path.

3. The transport device according to claim 2, wherein the setpoint profile is at least one of (i) a position of the carrier, (ii) is a velocity of the carrier, (iii) is an acceleration of the carrier, and (iv) is a jerk of the carrier.

4. The transport device according to claim 1, wherein the setpoint profile segments for the at least two coils partly overlap each other to form the setpoint profile for the movement path.

5. The transport device according to claim 1, wherein the control unit comprises:
   a setpoint generator configured to generate the setpoint profile segment for each coil based on the setpoint profile and dependent on the setpoint profile segment for an adjacent coil of the at least two coils, and
   a determining module configured to determine whether an actual position detected by a sensor is present in the setpoint profile segment for a coil of the at least two coils to which the sensor is allocated,
   wherein the control unit is configured to control activation and deactivation of the coils based whether the actual position detected by the sensor is present in the setpoint profile segment for the coil of the at least two coils to which the sensor is allocated.

6. The transport device according to claim 1, further comprising:
   at least two sensors configured to detect at least one of a position and a velocity of the carrier, the at least two sensors positioned such that two of the sensors are each positioned adjacent to one of the coils of the at least two coils.

7. The transport device according to claim 1, wherein the control unit and the sensors are connected by a bus.

8. The transport device according to claim 7, wherein the bus is a serial bus.

9. The transport device according to claim 1, the control unit further configured to:
   store the at least two setpoint profile segments.

10. A machine for treating a semiconductor wafer, the machine comprising:
    a transport device configured to transport the semiconductor wafer in the machine, the transport device including:
       at least two coils configured to drive the semiconductor wafer along a predetermined movement path; and
       a control unit configured to:
          generate a setpoint profile, the setpoint profile being at least a third order function;
          generate at least two setpoint profile segments based on the setpoint profile, the at least two setpoint profile segments corresponding to the at least two coils respectively; and
          control a movement of the semiconductor wafer along the predetermined movement path by driving each of the at least two coils based a respective one of the at least two setpoint profile segments.

11. A transport method for transporting a object, the method comprising:
    generating a setpoint profile, the setpoint profile being at least a third order function;
    generating at least two setpoint profile segments based on the setpoint profile, the at least two setpoint profile segments corresponding to the at least two coils respectively; and
    driving the object along a predetermined movement path under the control of a control unit based on by driving each of the at least two coils based a respective one of the at least two setpoint profile segments.

* * * * *